(12) United States Patent
Ye et al.

(10) Patent No.: US 6,638,365 B2
(45) Date of Patent: Oct. 28, 2003

(54) METHOD FOR OBTAINING CLEAN SILICON SURFACES FOR SEMICONDUCTOR MANUFACTURING

(75) Inventors: Jianhui Ye, San Jose, CA (US); Simon Chooi, Singapore (SG); Alex See, Singapore (SG)

(73) Assignees: Chartered Semiconductor Manufacturing Ltd., Singapore (SG); Institute of Materials Research and Engineering, Singapore (SG)

( * ) Notice: Subject to any disclaimer, the term of this patent is extended or adjusted under 35 U.S.C. 154(b) by 57 days.

(21) Appl. No.: 09/972,504

(22) Filed: Oct. 9, 2001

(65) Prior Publication Data

US 2003/0069151 A1 Apr. 10, 2003

(51) Int. Cl.$^7$ ................................................. B08B 3/00
(52) U.S. Cl. ................................. 134/26; 134/2; 134/3; 134/27; 134/28; 134/41; 134/902; 216/96; 216/99; 216/100; 216/101; 216/103; 216/104; 570/175; 638/906
(58) Field of Search ............................ 134/2, 3, 26, 27, 134/28, 41, 902; 216/96, 99, 100, 101, 103, 104; 510/175; 438/906

(56) References Cited

U.S. PATENT DOCUMENTS

| | | | |
|---|---|---|---|
| 4,759,823 A * | 7/1988 | Asselanis et al. ............ 216/101 |
| 5,454,901 A | 10/1995 | Tsuji ....................... 156/643.1 |
| 5,650,043 A | 7/1997 | Kaji et al. ................. 156/662.1 |
| 5,679,171 A | 10/1997 | Saga et al. ....................... 134/3 |
| 5,712,198 A * | 1/1998 | Shive et al. .................. 438/745 |
| 5,914,507 A * | 6/1999 | Polla et al. ................... 257/254 |
| 5,976,988 A | 11/1999 | Konuma et al. ............. 438/745 |
| 6,092,539 A | 7/2000 | Chang et al. .............. 134/57 R |
| 6,132,522 A * | 10/2000 | Verhaverbeke et al. ........ 134/26 |
| 6,230,720 B1 * | 5/2001 | Yalamanchili et al. ........ 134/1.3 |
| 6,290,777 B1 * | 9/2001 | Imaoka et al. .................. 134/3 |
| 6,383,723 B1 * | 5/2002 | Iyer et al. ..................... 430/327 |
| 6,475,893 B2 * | 11/2002 | Giewont et al. .............. 438/586 |
| 6,503,333 B2 * | 1/2003 | Twu et al. ....................... 134/3 |
| 2001/0037822 A1 * | 11/2001 | Elsawy et al. ................. 134/30 |

* cited by examiner

Primary Examiner—Randy Gulakowski
Assistant Examiner—M. Kornakov
(74) Attorney, Agent, or Firm—George O. Saile; Rosemary L. S. Pike

(57) ABSTRACT

A method of preparing a silicon surface for a subsequent processing said such as thermal oxidation, or metal silicide formation, via use of a novel wet chemical clean procedure, has been developed. The novel wet chemical clean procedure is comprised of three specific stages, with the first stage featuring the removal of organic contaminants and the growth of a native oxide layer on the silicon surface. A second stage features removal of the native oxide layer and removal of metallic contaminants from the silicon surface, while the third stage is used to dry the silicon surface. The novel wet chemical clean procedure is performed in less time, and using less chemicals, then counterpart wet chemical cleans also used for the preparation of silicon surfaces for subsequent processing steps.

17 Claims, 2 Drawing Sheets

| New Wet Chemical Cleaning | | | | Old Wet Chemical Clean (RCA Clean) | | | |
|---|---|---|---|---|---|---|---|
| Step No. | Chemistry | Temp (°C) | Time (sec.) | Step No. | Chemistry | Temp (°C) | Time (sec.) |
| 1 | $H_2SO_4:H_2O_2.(4:1)$ | 120±5 | 500-700 | 1 | $H_2SO_4:H_2O_2.(4:1)$ | 120±5 | 600 |
| 2 | $NH_4F:HCL:H_2O.(5:1:100)$ | 20-30 | 200-400 | 2 | $NH_4OH:H_2O_2:H_2O(1:2:10)$ | 65-75 | 600 |
| 3 | Isopropyl Alcohol | 20-25 | 275-325 | 3 | $HCL:H_2O_2:H_2O(1:1:5)$ | 45-55 | 600 |
| | | | | 4 | Diluted HF (DHF) | 20-35 | 75 |
| | | | | 5 | Isopropyl Alcohol | 20-35 | 300 |

Total time used: 975-1425 seconds
Total tanks used: 3

Total time used: 2185 seconds
Total tanks used: 5

*FIG. 1*

| Wet Chemical Cleaning Process | Metallic Impurities (unit: 1E10 atoms/cm$^2$) | | | | |
|---|---|---|---|---|---|
| | Ti | Fe | Ni | Cu |
| Before Old Wet Chemical Clean (RCA Clean) | 73 | 261 | 142 | 400 |
| Post Old Wet Cemical Clean | 0.2 | 4 | 0.21 | 0.16(<0.2) |
| Before New Wet Chemical Clean (RCA Clean) | 84 | 227 | 149 | 376 |
| Post New Wet Cemical Clean | 0.01(<0.2) | 2.3 | 0.12(<0.2) | 0.05(<0.2) |

FIG. 2

METHOD FOR OBTAINING CLEAN SILICON SURFACES FOR SEMICONDUCTOR MANUFACTURING

BACKGROUND OF THE INVENTION (1) Field of the Invention

The present invention relates to methods used to fabricate semiconductor devices, and more specifically to a method used to prepare the surface of a semiconductor substrate for subsequent processing sequences.

(2) Description of Prior Art

Micro-miniaturization, or the ability to fabricate semiconductor devices comprised with sub-micron features, have allowed the semiconductor industry to improve device performance while still decreasing fabrication costs. The use of smaller active device regions allow performance degrading parasitic capacitances to be reduced, while the use of smaller features result in a greater number of smaller semiconductor clips to be obtained from a specific size starting substrate, thus reducing the processing cost of a specific semiconductor chip. However the advent of micro-miniaturization can place more stringent demands on specific semiconductor processes, such as the ability to grow a thin gate insulator layers (silicon dioxide, silicon oxynitride, high k dielectrics, etc). With the arrival of micro-miniaturization metal oxide semiconductor (MOS), complimentary MOS (CMOS), and bipolar—CMOS (BiCMOS), devices are designed to operate at low voltages, thus necessitating the growth of a gate insulator layer comprised at a thickness of less than 100 Angstroms. The ability to thermally grow insulator layers (silicon dioxide, silicon oxynitride, high k dielectrics, etc), at these thicknesses, less than 100 Angstroms, demands ultra-clean, starting silicon surfaces. Therefore small amounts of metallic impurities residing on the silicon surface, which may not have deleteriously influenced the ability to thermally grow a thicker, high integrity silicon dioxide layer, now for thinner silicon dioxide layers can interfere with the attainment of a high quality, silicon dioxide layer.

This invention will teach a novel process sequence for preparing the surface of a semiconductor substrate for subsequent semiconductor procedures, such as the growth of a thin silicon dioxide gate insulator layer, or the formation of a metal silicide layer. This invention will describe the chemistry needed to achieve the desired surface, as well as presenting a surface preparation procedure with reduced process time, when compared to counterpart surface preparation procedures, thus reducing processing costs. Prior art, such as Kaji et al, in U.S. Pat. No. 5,650,043, Konuma et al, in U.S. Pat. No. 5,976,988, and Tsuji, in U.S. Pat. No. 5,454,901, describe procedures for cleaning a semiconductor surface prior to a subsequent process step. These prior arts however do not describe the unique chemistry described in the present invention, in which a greater level of metallic impurities are removed from a semiconductor surface, in a shorter period of time, when compared to counterpart processes which do not remove comparable levels of metallic impurities while however still requiring longer clean times.

SUMMARY OF THE INVENTION

It is an object of this invention to provide a method of preparing a semiconductor surface for subsequent processing steps via removal of metallic impurities, and etching of the exposed semiconductor substrate using a wet chemical clean procedure featuring $NH_4F$ and HCl as major components of the wet chemical solution.

It is another object of this invention to reduce the cost of, and to minimize the process time for, the wet chemical clean procedure employed to prepare a semiconductor substrate for subsequent processing steps.

In accordance with the present invention a method of preparing the surface of a semiconductor substrate for subsequent processing steps, in regards to removal of metallic impurities from a semiconductor substrate, via use of a wet chemical clean procedure, is described. A semiconductor substrate, being prepared for a silicon dioxide gate insulator layer, thermal oxidation procedure, is first subjected to a $H_2SO_4:H_2O_2$ solution to remove organic contamination from, and to grow a native oxide on, the exposed semiconductor substrate. An $NH_4F:HCl:H_2O$ solution is then used to remove native oxide and desorb metallic impurities from the semiconductor surface. A drying cycle using iso-propyl alcohol (IPA), concludes the wet clean procedure. The wet clean procedure is also used to prepare surfaces prior to metal silicide formation, as well to remove organic contaminants, as well as metallic impurities, after such process steps as chemical mechanical polishing, and photoresist removal.

BRIEF DESCRIPTION OF THE DRAWINGS

The object and other advantages of this invention are best described in the preferred embodiment with reference to the attached drawings that include:

FIG. 1, via use of a tabular format, describes the stages of a new wet chemical clean procedure used to prepare a semiconductor substrate for a subsequent process step, regarding the chemical component used, as well as the temperature, and the time used, for each specific stage of the wet clean procedure.

FIG. 2, via use of a tabular format, compare the novel wet chemical clean procedure described in this invention, to a previously used wet chemical clean, in terms of removal of specific metallic impurities, intentionally contaminated on the surface of a semiconductor substrate.

DESCRIPTION OF THE PREFERRED EMBODIMENTS

A method of preparing a semiconductor substrate surface for a subsequent processing step via use of a novel wet chemical clean procedure featuring increased removal of metallic impurities, and reduced processing time, when compared to a previously used, counterpart wet chemical clean procedures, used for an identical purpose, will now be described in detail. A semiconductor substrate comprised with a surface requiring low levels of metallic impurities to allow success of subsequent processing steps, such as growth of a gate insulator, or formation of a metal silicide layer, to be realized, is subjected to a new wet chemical clean procedure now described in this invention. The three major stages of the new wet chemical procedure used for preparation of the semiconductor substrate surface for a subsequent process step, is shown in table form in FIG. 1. The first stage of the wet chemical procedure is exposure of the semiconductor substrate to a sulfuric—peroxide solution. This is accomplished using a $H_2SO_4:H_2O_2$ solution, preferably at a ratio of 4:1, at a temperature preferably between about 115 to 125° C., for a time preferably between about 500 to 700 sec. The ratio of $H_2SO_4:H_2O_2$ is between 1:100 and 100:1, temperature between 20 and 250° C. and the duration between 1 and 1000 seconds. This stage of the wet chemical procedure results in removal of organic contaminants from the surface of the semiconductor substrate, followed by growth of a native oxide layer, at a thickness between about 10 to 30 Angstroms. Following this procedure a quick dump rinsing (QDR), step is performed to completely remove all traces of the $H_2SO_4$:$H_2O_2$ solution from the semiconductor substrate. The QDR step consumes between about 250 to 350 sec.

The second stage of the new wet chemical clean procedure, the critical stage of this procedure, is next addressed. The semiconductor substrate is now exposed to a solution comprised of $NH_4F$:$HCl$:$H_2O$, preferably at a ratio of 5:1:100, preferably at a temperature between about 20 to 30° C., preferably for a period of time between about 200 to 400 sec. This critical step features the $NH_4F$ component removing the native oxide, formed on the semiconductor substrate during the first stage of the new wet clean procedure, as well etching or roughening of the oxide-free semiconductor surface. The HCl component is used as a complexing agent to desorb metallic impurities from the exposed semiconductor substrate. The ratio of components used for the second stage of the new wet chemical clean procedure should satisfy: $x \geq 1$, $y \geq 1$, and $z \geq 20$, for the solution of $x(NH_4F)$:$y(HCl)$:$z(H_2O)$. In addition the temperature should be between 4 to 100° C., and the duration between about 1 and 1000 seconds. The old wet clean procedure, although identical to the new wet clean procedure in regards to the first stage of the procedure, differs greatly in regards to the critical second stage. For example the second stage of the old wet clean procedure, used to remove native oxide and desorb metallic impurities, is implemented using three wet clean cycles, consuming a period of time of about 1300 sec, compared to the second stage of the new wet chemical clean procedure, offering superior results and only consuming about 300 sec of process time. The second stage of the old wet chemical clean procedure is comprised of: a first cycle using 1:2:10, $NH_4OH$:$H_2O_2$:$H_2O$, also known as Standard Clean-1, or SC-1, at a temperature between about 65 to 75° C., for a time of about 600 sec; a second cycle using 1:1:5, $HCl$:$H_2O_2$:$H_2O$, (also known as Standard Clean-2, or SC-2), at a temperature between about 45 to 55° C., for a time of about 600 sec; and a third cycle using dilute hydrofluoric acid at a temperature between about 20 to 25° C., for a time of about 75 sec. Therefore the new wet chemical clean procedure, during the critical second stage offers decreased cycle time and reductions in the consumption of chemicals, when compared to the second stage of the old wet clean procedure. In addition the surface roughness resulting from the HCl component, in both procedures, is less severe for the new wet chemical clean procedure. At the completion of the second stage of the new wet chemical clean procedure another QDR cycle is employed, for a time between about 275 to 325 sec.

The third stage of the new wet chemical clean procedure involves the drying stage of the procedure, accomplished via the use of isopropyl alcohol (IPA), for a time between about 275 to 325 sec. The identical IPA procedure is used with the old wet chemical clean procedure. In addition to supplying cleaner surfaces, and using less chemicals than the old wet chemical clean procedure, the new wet clean procedure is accomplished using only about 1800 sec, compared to about 3075 sec., used with the old wet chemical clean procedure.

If desired the first stage of the new wet chemical clean procedure can be performed using ozone and deionized water, at a temperature between about 4 to 100° C., with a concentration of ozone between about 0.1 to 100 ppm. The first stage of this procedure can also be performed in an $S_2O_8^{2-}$ solution, again performed at a temperature between about 4 to 100° C. The IPA procedure used in the third stage of the new wet chemical clean procedure, if desired, can be replaced by a deionized water treatment, performed at a temperature between about 22 to 100° C., for a time between about 1 to 1000 sec, and therefore by a drying process, (for example spin drying). The new wet chemical clean procedure is accomplished in an apparatus comprised of between about 1 to 3 tanks.

The effectiveness of the new wet chemical clean procedure, described in this invention, is shown in a table format, in FIG. 2. Semiconductor substrates are intentionally subjected to metallic impurities, measured, then removed via the new wet chemical clean procedure, disclosed in this present invention. For comparison purposes the same contamination is removed using the old wet chemical clean procedure. Selective metallic elements were used to contaminate the semiconductor substrates, then measured using total reflection X-ray fluorescence spectrometry (TXRF). FIG. 2, shows the level of intentional contamination, regarding titanium (Ti), iron (Fe), nickel (Ni), and copper (Cu). The contaminated substrates were then subjected to the old wet chemical clean procedure, while counterparts were subjected to the new wet chemical clean procedure, followed by TXRF evaluation. FIG. 2, clearly demonstrates the effectiveness of the new wet chemical clean procedure, over the old wet chemical clean procedure, in removing the metallic impurities. In all cases the new wet chemical clean procedure resulted in a lower level of metallic to remaining on the surface of the intentionally contaminated semiconductor substrate. For example a copper content of only 0.05E10 atoms/$cm^2$, was measured after subjection to the new wet chemical clean procedure, about 3× less than the level of copper remaining after subjection to the old wet chemical clean procedure, which was measured as 0.16E10 atoms/$cm^2$.

The new wet clean chemical procedure, described in this invention, can be used prior to the thermal oxidation procedure used to grow thin gate insulator layers for sub-micron CMOS devices. The ability of the new wet chemical clean procedure to remove metallic impurities from a semiconductor surface allows the integrity of the thin gate insulator layer, in terms of leakage and breakdown voltage, to be improved when compared to counterpart gate insulator layers formed without the use of the new wet chemical pre-clean procedure. The new wet chemical clean procedure can also be employed as a pre-clean procedure prior to formation of a metal silicide layer. This would be accomplished by subjecting a silicon surface to the new wet chemical clean procedure prior to deposition of the metal component of the metal silicide layer. In addition the new wet chemical clean procedure can be used as a post-clean procedure, performed after such steps as chemical mechanical polishing, or after photoresist removal.

While this invention has been particularly shown and described with reference to, the preferred embodiments thereof, it will be understood by those skilled in the art that various changes in form and details may be made without departing from the spirit and scope of this invention.

What is claimed is:

1. A method of preparing a surface of silicon containing semiconductor substrate for a subsequent process step, via exposure to a new wet chemical clean procedure, comprising the steps of:

performing a first stage of said new wet chemical clean procedure to remove organic contaminants from said surface of said semiconductor substrate, and to grow a native oxide layer on said surface of said semiconductor substrate;

performing a second stage of said new wet chemical clean procedure to remove said native oxide layer, to remove metallic components from said surface of said semiconductor substrate, and to etch surface of native oxide free, said semiconductor substrate with solution, which includes $NH_4F$ and HCl; and performing a third stage of said new wet chemical clean procedure to dry said surface of said semiconductor substrate.

2. The method of claim 1, wherein said first stage of said new wet chemical clean procedure is performed in an $H_2SO_4:H_2O_2$ solution, at a ratio of 1:1 to 1:100, or to 100:1, at a temperature between about 20 to 250° C., for a time between about 1 to 1000 sec.

3. The method of claim 1, wherein said first stage of said new wet chemical clean procedure is performed in a 4:1 $H_2SO_4:H_2O_2$ solution, at a temperature between about 20 to 250° C., for a time between about 1 to 1000 sec.

4. The method of claim 1, wherein said first stage of said new wet chemical clean procedure is performed in a $S_2O_8^{2-}$ solution, at a temperature between about 4 to 100° C.

5. The method of claim 1, wherein said first stage of said new wet chemical clean procedure is performed in ozone and deionized water, at a temperature between about 4 to 100° C., with a concentration of ozone between about 0.1 to 100 ppm.

6. The method of claim 1, wherein said second stage of said wet chemical said a solution wherein said solution comprised of $x(NH_4F): y(HCl): z(H_2O)$, where $x \geq 1$, $y \geq 1$, and $z \geq 20$.

7. The method of claim 1, wherein said second stage of said wet chemical clean procedure is performed in said solution wherein said solution comprised of $x(NH_4F): y(HCl): z(H_2O)$, where $x \geq 1 y \geq 1$, and $z \geq 20$ at a temperature between about 4 to 100° C., and for a period of time between about 1 to 1000 sec.

8. The method of claim 1, wherein said third stage of said wet chemical clean procedure is performed using isopropyl alcohol, (IPA), for a time between about 275 to 325 sec.

9. The method of claim 1, wherein said subsequent process step, said semiconductor substrate is being prepared for, is the thermal growth of a silicon dioxide gate insulator layer.

10. The method of claim 1, wherein said subsequent process step, said semiconductor substrate is being prepared for, is the deposition of the metal layer used for formation of a subsequent metal silicide layer.

11. The method of claim 1, wherein said new wet chemical clean procedure is used as a post-clean procedure, after a chemical mechanical polishing procedure, or after a photoresist removal procedure.

12. A method of preparing a silicon surface, via use of a new wet chemical clean procedure, for a thermal oxidation procedure employed for growth of a gate insulator layer, comprising the steps of:

performing a first stage of said new wet chemical clean procedure in a $H_2SO_4:H_2O_2$ solution, to remove organic contamination from said silicon surface, and to grow a native oxide layer on organically uncontaminated, said silicon surface;

performing a second stage of said new wet chemical clean procedure in an $x(NH_4F): y(HCl): z(H_2O)$ solution, to remove said native oxide layer from said silicon surface, to etch surface of native oxide free, said semiconductor substrate, and to remove metallic impurities from said silicon surface; and performing a third stage of said new wet chemical clean procedure using isopropyl alcohol to dry said silicon surface.

13. The method of claim 12, wherein said first stage of said new wet chemical clean procedure is performed in a solution of $H_2SO_4:H_2O_2$, at a ratio of 1:1 to 100:1 or to 1:100, at a temperature between 20 to 250° C., for a time between about 1 to 1000 sec.

14. The method of claim 12, wherein said first stage of said new wet chemical clean procedure is performed in a 4:1 $H_2SO_4:H_2O_2$ solution, at a temperature between about 20 to 250° C., for a time between about 1 to 1000 sec.

15. The method of claim 12, wherein said second stage of said new wet chemical clean procedure is performed in said $x(NH_4F): y(HCl): z(H_2O)$ solution, defined by $x \geq 1$, $y \geq 1$, and $z \geq 20$.

16. The method of claim 12, wherein said second stage of said new wet chemical clean procedure, accomplished in said $x(NH_4F): y(HCl): z(H_2O)$ solution, is performed at a temperature between about 4 to 100° C., and for a period of time between about 1 to 1000 sec.

17. The method of claim 12, wherein said third stage of said new wet chemical clean procedure, accomplished using said isopropyl alcohol, (IPA), is performed for a time between about 1 to 1000 sec.

* * * * *